(12) United States Patent
Osborne et al.

(10) Patent No.: US 10,969,406 B2
(45) Date of Patent: Apr. 6, 2021

(54) HIGH SPEED ATOMIC FORCE PROFILOMETRY OF LARGE AREAS

(71) Applicant: Bruker Nano, Inc., Santa Barbara, CA (US)

(72) Inventors: Jason Osborne, Lompoc, CA (US); Vladimir Fonoberov, Santa Barbara, CA (US); Sean Michael Hand, Santa Barbara, CA (US)

(73) Assignee: Bruker Nano, Inc., Santa Barbara, CA (US)

( * ) Notice: Subject to any disclaimer, the term of this patent is extended or adjusted under 35 U.S.C. 154(b) by 0 days.

(21) Appl. No.: 16/538,474

(22) Filed: Aug. 12, 2019

(65) Prior Publication Data
US 2020/0049734 A1 Feb. 13, 2020

Related U.S. Application Data

(60) Provisional application No. 62/717,557, filed on Aug. 10, 2018.

(51) Int. Cl.
| | | |
|---|---|---|
| *G01Q 60/30* | (2010.01) | |
| *G01Q 10/06* | (2010.01) | |
| *G01Q 60/38* | (2010.01) | |
| *G01R 1/067* | (2006.01) | |
| *G01Q 20/02* | (2010.01) | |

(52) U.S. Cl.
CPC .............. *G01Q 60/30* (2013.01); *G01Q 60/38* (2013.01); *G01R 1/067* (2013.01); *G01Q 10/06* (2013.01); *G01Q 20/02* (2013.01)

(58) Field of Classification Search
CPC ...... G01Q 10/06; G01Q 10/065; G01Q 20/02; G01Q 10/02; G01Q 10/04; G01Q 10/045; G01Q 30/04; G01Q 60/30; G01Q 60/34; G01Q 60/38; G01Q 70/02; G01Q 70/04; G01Q 70/08; G01Q 70/10; G01Q 70/16; G01Q 80/00; G01N 2021/8845; G01N 2021/95615; G01N 21/8806; G01N 21/9501
USPC .......................................... 250/306; 850/1, 3
See application file for complete search history.

(56) References Cited

U.S. PATENT DOCUMENTS

| | | | |
|---|---|---|---|
| 2002/0062684 A1 | 5/2002 | Adderton et al. | |
| 2002/0092340 A1* | 7/2002 | Prater | G02B 7/1821 73/24.02 |
| 2002/0125427 A1* | 9/2002 | Chand | G01Q 10/04 250/306 |

(Continued)

FOREIGN PATENT DOCUMENTS

KR 1020160142483 12/2016

OTHER PUBLICATIONS

Clayton et al., "A Review of Feedforward Control Approaches in Nanopositioning for High-Speed SPM", ASME Journal of Dynamic Systems, Measurement, and Control, vol. 131, Nov. 2009, p. 061101-1-061101-19, Oct. 28, 2019.

(Continued)

*Primary Examiner* — David A Vanore
(74) *Attorney, Agent, or Firm* — Boyle Fredrickson S.C.

(57) ABSTRACT

An apparatus and method of operating an atomic force profiler (AFP), such as an AFM, using a feedforward control signal in subsequent scan lines of a large area sample to achieve large throughput advantages in, for example, automated applications.

19 Claims, 5 Drawing Sheets

(56) References Cited

U.S. PATENT DOCUMENTS

| | | | | |
|---|---|---|---|---|
| 2002/0156594 A1* | 10/2002 | Houge | ............... | G03F 7/70491 |
| | | | | 702/127 |
| 2003/0209060 A1* | 11/2003 | Proksch | ................... | G01B 5/28 |
| | | | | 73/105 |
| 2007/0093971 A1* | 4/2007 | Candy | ................. | G01N 29/036 |
| | | | | 702/27 |
| 2008/0188014 A1* | 8/2008 | Amos | ............... | H01L 21/82386 |
| | | | | 438/8 |
| 2011/0035848 A1* | 2/2011 | Perkins | ................. | G01Q 20/02 |
| | | | | 850/3 |
| 2012/0066799 A1* | 3/2012 | Esch | ..................... | G01Q 10/06 |
| | | | | 850/1 |
| 2015/0137712 A1 | 5/2015 | Youcef-Toumi et al. | | |
| 2017/0074901 A1* | 3/2017 | Humphris | ............ | G01Q 10/045 |
| 2017/0199219 A1* | 7/2017 | Zou | ...................... | G01Q 10/065 |
| 2019/0391088 A1* | 12/2019 | Lynch | ............... | G01N 21/9501 |

OTHER PUBLICATIONS

Uchihashi et al., "Feed-Forward Compensation for High-Speed Atomic Force Microscopy Imaging of Biomolecules", Japanese Journal of Applied Physics, vol. 45, No. 3B, 2006, pp. 1904-1908, Mar. 27, 2006.

\* cited by examiner

HIGH SPEED ATOMIC FORCE PROFILOMETRY OF LARGE AREAS

CROSS-REFERENCE TO RELATED APPLICATIONS

This application claims priority under 35 USC § 1.119(e) to U.S. Provisional Patent Application Ser. No. 62/717,557, filed Aug. 10, 2018. The subject matter of this application is hereby incorporated by reference in its entirety.

BACKGROUND OF THE INVENTION

Field of the Invention

The preferred embodiments are directed to an Atomic Force Profilometry (AFP) method to image large sample areas, in particular, for detection of surface feature deviations from the average sample plane, referred to as "hot spots."

Description of Related Art

AFPs, including scanning probe microscopes such as atomic force microscopes (AFMs) are devices which employ a probe having a tip, and causing the tip to interact with the surface of a sample with appropriate forces to characterize the surface down to atomic dimensions. Generally, the probe is introduced to a surface of a sample and by providing relative scanning movement between the tip and the sample, surface characteristic data can be acquired over a particular region of the sample, and a corresponding map of the sample can be generated.

A typical AFM system is shown schematically in FIG. 1. An AFM 10 employing a probe device 12 including a probe 14 having a cantilever 15. Scanner 24 generates relative motion between the probe 14 and sample 22 while the probe-sample interaction is measured. In this way images or other measurements of the sample can be obtained. Scanner 24 is typically comprised of one or more actuators that usually generate motion in three orthogonal directions (XYZ). Often, scanner 24 is a single integrated unit that includes one or more actuators to move either the sample or the probe in all three axes, for example, a piezoelectric tube actuator. Alternatively, the scanner may be an assembly of multiple separate actuators. Some AFMs separate the scanner into multiple components, for example an XY scanner that moves the sample and a separate Z-actuator that moves the probe. The instrument is thus capable of creating relative motion between the probe and the sample while measuring the topography or some other surface property of the sample as described, e.g., in Hansma et al. U.S. Pat. No. RE 34,489; Elings et al. U.S. Pat. No. 5,266,801; and Elings et al. U.S. Pat. No. 5,412,980.

In a common configuration, probe 14 is often coupled to an oscillating actuator or drive 16 that is used to drive probe 14 at or near a resonant frequency of cantilever 15. Alternative arrangements measure the deflection, torsion, or other motion of cantilever 15. Probe 14 is often a microfabricated cantilever with an integrated tip 17.

Commonly, an electronic signal is applied from an AC signal source 18 under control of an SPM controller 20 to cause actuator 16 (or alternatively scanner 24) to drive the probe 14 to oscillate. The probe-sample interaction is typically controlled via feedback by controller 20. Notably, the actuator 16 may be coupled to the scanner 24 and probe 14 but may be formed integrally with the cantilever 15 of probe 14 as part of a self-actuated cantilever/probe.

Often a selected probe 14 is oscillated and brought into contact with sample 22 as sample characteristics are monitored by detecting changes in one or more characteristics of the oscillation of probe 14, as described above. In this regard, a deflection detection apparatus 25 is typically employed to direct a beam towards the backside of probe 14, the beam then being reflected towards a detector 26. As the beam translates across detector 26, appropriate signals are processed at block 28 to, for example, determine RMS deflection and transmit the same to controller 20, which processes the signals to determine changes in the oscillation of probe 14. In general, controller 20 generates control signals to maintain a relative constant interaction between the tip and sample (or deflection of the lever 15), typically to maintain a setpoint characteristic of the oscillation of probe 14. More particularly, controller 20 may include a PI Gain Control block 32 and a High Voltage Amplifier 34 that condition an error signal obtained by comparing, with circuit 30, a signal corresponding to probe deflection caused by tip-sample interaction with a setpoint. For example, controller 20 is often used to maintain the oscillation amplitude at a setpoint value, $A_S$, to insure a generally constant force between the tip and sample. Alternatively, a setpoint phase or frequency may be used.

A workstation 40 is also provided, in the controller 20 and/or in a separate controller or system of connected or stand-alone controllers, that receives the collected data from the controller and manipulates the data obtained during scanning to perform point selection, curve fitting, and distance determining operations.

AFMs may be designed to operate in a variety of modes, including contact mode and oscillating mode. Operation is accomplished by moving either the sample or the probe assembly up and down relatively perpendicular to the surface of the sample in response to a deflection of the cantilever of the probe assembly as it is scanned across the surface. Scanning typically occurs in an "x-y" plane that is at least generally parallel to the surface of the sample, and the vertical movement occurs in the "z" direction that is perpendicular to the x-y plane. Note that many samples have roughness, curvature and tilt that deviate from a flat plane, hence the use of the term "generally parallel." In this way, the data associated with this vertical motion can be stored and then used to construct an image of the sample surface corresponding to the sample characteristic being measured, e.g., surface topography. In one mode of AFM operation, known as TappingMode™ AFM (TappingMode™ is a trademark of the present assignee), the tip is oscillated at or near a resonant frequency of the associated cantilever of the probe. A feedback loop attempts to keep the amplitude of this oscillation constant to minimize the "tracking force," i.e. the force resulting from tip/sample interaction. Alternative feedback arrangements keep the phase or oscillation frequency constant. As in contact mode, these feedback signals are then collected, stored, and used as data to characterize the sample. Note that "SPM" and the acronyms for the specific types of SPMs, may be used herein to refer to either the microscope apparatus or the associated technique, e.g., "atomic force microscopy." In a recent improvement on the ubiquitous TappingMode™, called Peak Force Tapping® (PFT) Mode, discussed in U.S. Pat. Nos. 8,739,309, 9,322,842 and 9,588,136, which are expressly incorporated by reference herein, feedback is based on force (also known as a transient probe-sample interaction force) as measured in each oscillation cycle.

Regardless of their mode of operation, AFMs can obtain resolution down to the atomic level on a wide variety of insulating or conductive surfaces in air, liquid, or vacuum by using piezoelectric scanners, optical lever deflection detectors, and very small cantilevers fabricated using photolithographic techniques. Because of their resolution and versatility, AFMs are important measurement devices in many diverse fields ranging from semiconductor manufacturing to biological research.

In this regard, AFMs may be employed in automated applications, including in high-precision manufacturing processes such as in semiconductor fabrication. Because AFMs can provide high resolution measurement of nanoscale surface features (e.g., topography), AFM has proven to be useful in the semiconductor space. However, classically, AFMs have been too slow for realistic, high throughput use required in a semi-fab facility. One measurement of interest in this environment is post-CMP (chemical mechanical polishing/planarization) "hot spot" detection. For AFM to be useful to make such measurements, data acquisition speed must be considered.

For example, the large sample areas needed to be measured for CMP hotspot detection (e.g., die area of about 33 mm×26 mm), an AFM operating in known modes would take six to seven days to collect the required measurement data. The primary problems center around the limited physical bandwidth of known AFM XY sample scanners, and the inability to accurately track sample features at high speed using known AFM feedback control. Yet, there is still desire to use AFM in automated applications given its advantages over other nanoscale measurement tools.

As a result, the AFM field, and more particularly automated AFM, was in need of a solution to measure large sample sizes such as those described above in less than 24 hours, and preferably, substantially less. Such a system would allow AFM to identify post-CMP hot spots, and thus open AFM to integration in the semiconductor fabrication process flow.

SUMMARY OF THE INVENTION

By using a feedforward control signal in subsequent scan lines of a large area sample, the preferred embodiments are able to achieve large throughput advantages over known atomic force profilometry (AFP) systems and methods.

In one preferred embodiment, a method of operating an atomic force microscope (AFM), includes providing relative scanning motion between a probe of the AFM and a sample at a first line of the sample. The deflection of the probe in response to the providing step is measured and the AFM controls the probe-sample separation according to a mode of AFM operation. Next, a Z feed forward control signal based on the measuring step is generated. Then, relative scanning motion between the probe and the sample is initiated at a second line of the sample. After measuring the deflection of the probe in the second line, the probe-sample separation is controlled. The feedforward Z signal is combined with the measured deflection corresponding to the second line to generate a HyperZ signal. This HyperZ signal is used in a next line of the scan as the Z feed forward control signal.

In another aspect of this embodiment, the method steps are repeated until a selected region of the sample is imaged.

According to another aspect of this embodiment, the method identifies a feature of interest (e.g., a post CMP hot spot) based on an output of the repeating step.

Another aspect of this embodiment is employed to perform high resolution AFM imaging of the feature of interest.

In a further aspect of this embodiment, the providing steps are performed at a speed greater than 2 mm/s, and preferably greater than 25 mm/s.

According to another aspect of this embodiment, the surface features of the sample are >2 nm at XY pixel sizes of <1 um, and wherein a lateral scanning speed is at least about 30 mm/s.

In another aspect of the preferred embodiments, an atomic force microscope (AFM) includes a scanner that provides relative scanning motion between a probe of the AFM and a sample, and a detector that measures the deflection of the probe in response to probe-sample interaction during AFM operation. A controller generates a feed forward Z signal based on the measured deflection corresponding to a first line of the scanning motion, and combines the feedforward Z signal with the measured deflection corresponding to a second line of the scanning motion to generate a HyperZ signal. In this case, the HyperZ signal is used in a next line of the scanning motion as the feed forward Z signal.

According to another preferred embodiment, a method of operating an atomic force profiling (AFP) instrument for post-CMP hotspot detection on a semiconductor sample, the method includes providing relative scanning motion between a probe of the AFP and a sample at a first line of the sample, and measuring the deflection of the probe in response to the providing step and controlling the probe-sample separation according to a mode of AFM operation. The method also includes generating a feed forward Z signal based on the measuring step, and providing relative scanning motion between the probe and the sample at a second line of the sample. Thereafter, the deflection of the probe is measured in a second line and the probe-sample separation is controlled according to a mode of AFM operation. The method includes combining the feedforward Z signal with the measured deflection corresponding to the second line to generate a HyperZ signal, and uses the HyperZ signal in a next line of the scan as the feed forward Z signal. The steps are repeated for a region of interest to generate HyperZ data based on the HyperZ signal. In this case, a post-CMP hotspot of the sample can be identified based on the HyperZ data.

In this embodiment of the invention, the providing step is performed at a speed greater than 33 mm/s.

These and other features and advantages of the invention will become apparent to those skilled in the art from the following detailed description and the accompanying drawings. It should be understood, however, that the detailed description and specific examples, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Preferred exemplary embodiments of the invention are illustrated in the accompanying drawings in which like reference numerals represent like parts throughout, and in which.

DETAILED DESCRIPTION OF THE PREFERRED EMBODIMENTS

Figure 1:
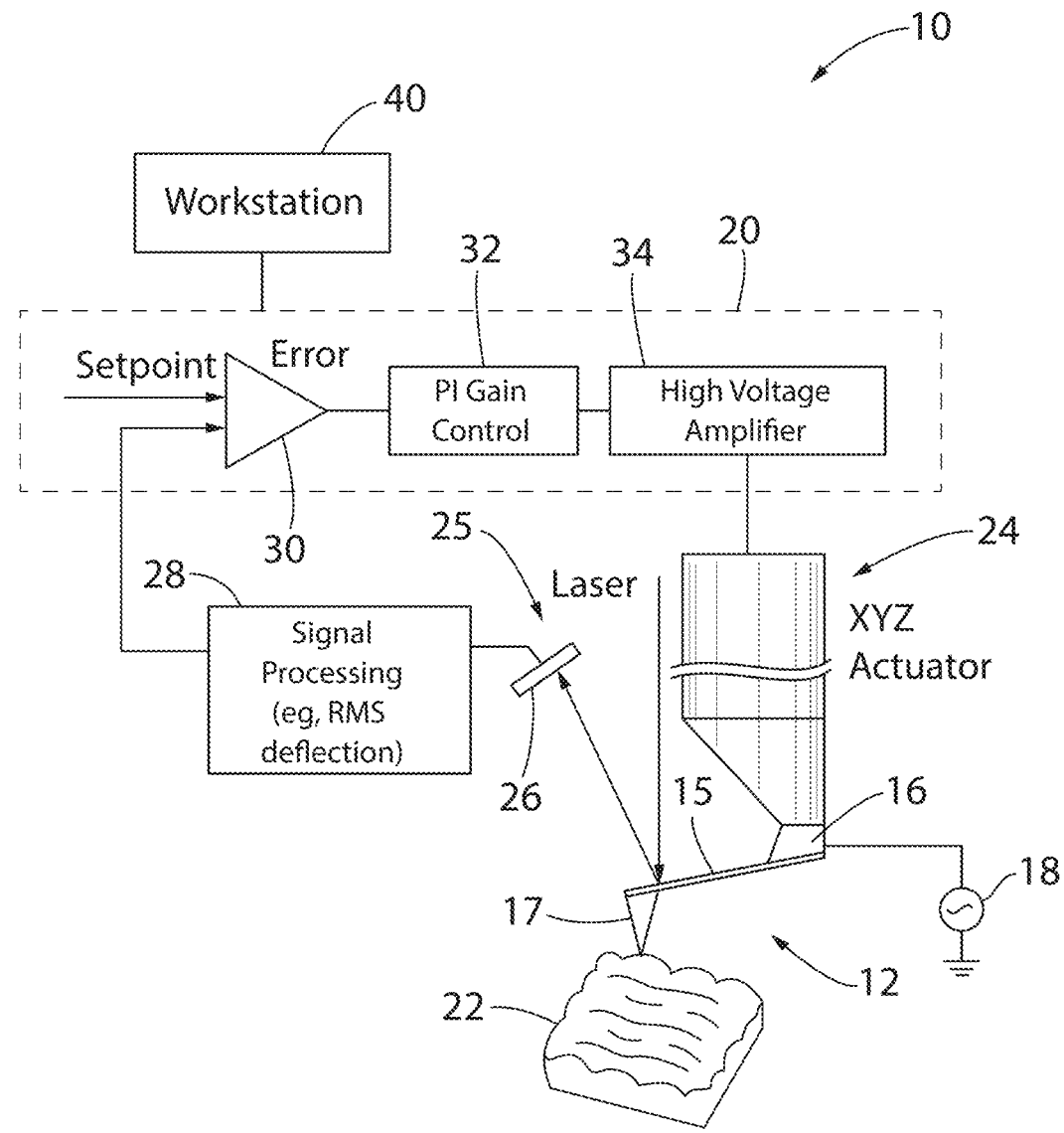
FIG. 1 is a schematic illustration of a Prior Art atomic force microscope AFM.

The preferred embodiments are directed to a new approach to Atomic Force Profilometry (AFP) which allows for full lithography scan fields to be measured, enabling post CMP hotspot detection and subsequent high resolution Atomic Force Microscopy (AFM) imaging for hot spot metrology. This new approach is capable of imaging a 33 mm×26 mm die area (33 mm×26 mm, e.g.) with high resolution detection of surface features with scanning speeds of greater than ~30 mm/s, about 2 orders of magnitude faster than conventional imaging. The new method enables full die mapping, while the detected hot spot can be analyzed with high resolution AFM imaging.

An Atomic Force Profilometry (AFP) method and system to image large areas (typically, a die area, e.g., 33 mm×26 mm) is shown in the drawings and described herein. The method is capable of detection of post-CMP surface feature deviations from the average sample plane, referred to as "hotspots." After identifying and locating these hotspots, they can then subsequently be re-imaged in high resolution AFM mode for metrology purposes.

The technique provides a combination of advanced AFM techniques including: use of the XY sample stage for the large area raster scan stage motion, automatic compensation of fast and slow scan axis sample tilt in the Z-axis, and the use of low stiffness Atomic Force Microscopy (AFM) probe cantilevers.

Figure 2:
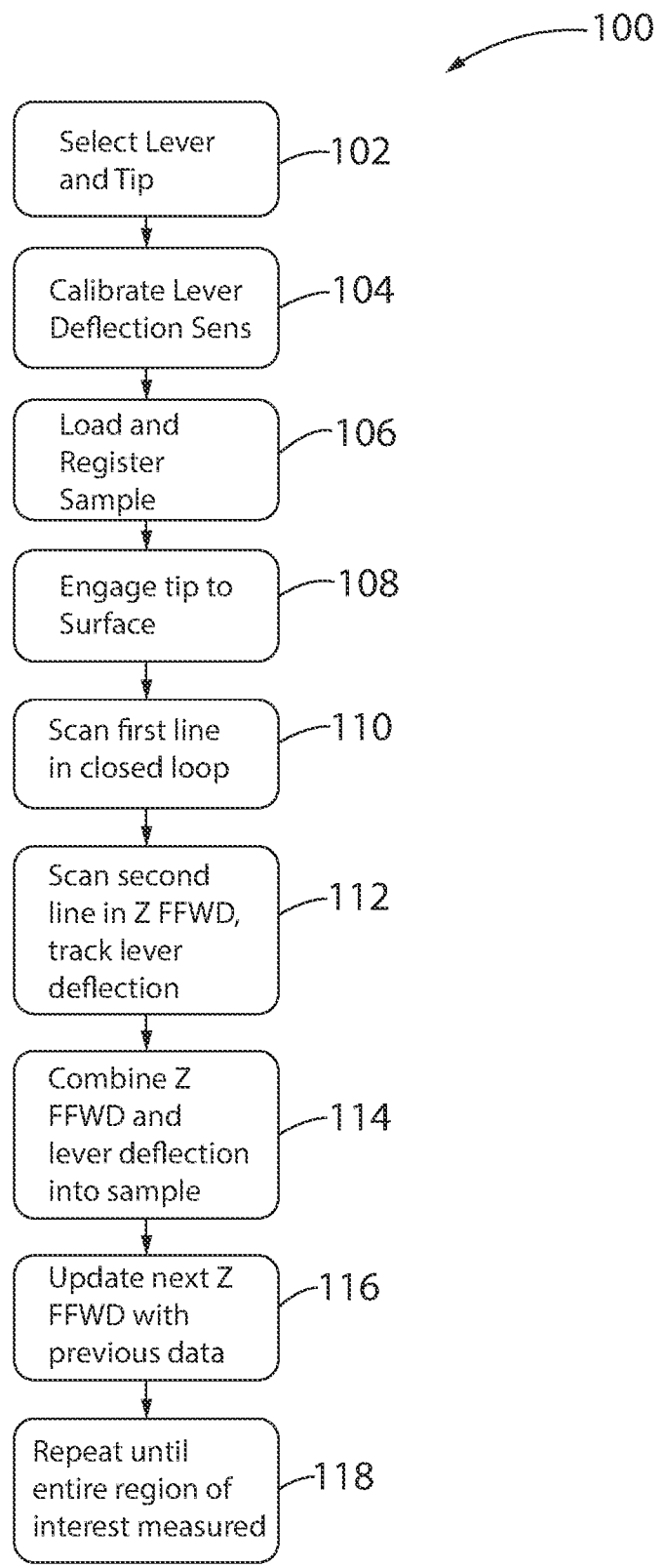
FIG. 2 is a flow chart of the AFM high speed data capture method of a preferred embodiment.

Turning initially to FIG. 2, a method 100 includes a selecting an AFM probe/cantilever combination in Block 102. This selection is based on scanning use that meets the requirements of tip sharpness needed for sample feature resolution and that also has a cantilever stiffness that balances both the flexural stiffness of the lever as well as the lever's resonant frequency. The goal is to maintain minimal tracking force impact to the sample surface, and maintain high speed response to changes in sample topography. For example, a lever having a stiffness (spring constant) of about 0.4 N/m and a resonant frequency of 40-70 kHz may be provided.

Method 100 next optionally includes calibrating the deflection sensitivity of the cantilever in Block 104. Though not necessary, such cantilever calibration is preferred. This minimizes the need to calibrate the AFM instrument itself. The preferred embodiments employ a method to automatically calibrate the deflection sensitivity of the AFM cantilever on an independent reference sample. (typical units— nm/V) This involves operating the AFM in contact mode over a NIST/SI traceable sample. Notably, calibration is required each time a new probe is used.

Next, in Block 106, the sample is loaded into the automated AFM system, and aligned such that the XY stage can locate the region of interest to be imaged with the AFM probe.

Once registered, the previously selected AFM probe, already installed in the system, calibrated, and readied for imaging use, is brought into contact with the sample surface at the region of interest in Block 108. After confirming that the tip is engaged to the sample, the XY stage moves at the preselected scan speed over the pre-selected scan length in Block 110. The AFM scanner system tracks the sample topography using the closed loop feedback mode in the Z axis of the AFM scanner. This Z-topography information is stored, but not displayed, for use in the next profile scan line. This information is sufficiently accurate for its purpose, which is to create a sort of baseline keeping the probe/tip within its +/−max Z-range for subsequent scanning, even though it does not track the surface perfectly at the selected scan speed (at least 30 mm/s).

When beginning the next scan line in Block 112, Z topography data from the initial closed loop feedback profile line is programmatically sent to the Z scanner for tracking the sample topography in a "feed forward tracking" manner (Z FFWD) while the XY stage traverses the profile line. Additionally, while traversing the second profile line, the vertical deflection signal of the calibrated cantilever is captured and summed into the programmatically defined Z topography data to generate a combined, single, representation of the sample topography from the two data sets in Block 114.

Any deviations from nominal deflection in the cantilever encountered during the second line are stored and added, pixel-by-pixel, to the prior line Z topography data to send as the updated programmatic Z tracking data in Block 116. This update to the sample tracking feed forward control (Z FFWD) is refined and updated for each subsequent profile line captured until the full region of interest is imaged (Block 118). Notably, in a preferred embodiment, data collected in the first profile line is not stored in the image. The image data collection starts from line 2. The line 2 stage motion is the reverse of line 1 stage motion. After line 2, there is an additional orthogonal stage offset to get to the next line.

After the full area of interest has been completed, areas within the profile area for high resolution AFM scanning can be automatically identified, manually identified, or manually entered for additional AFM based imaging. The appropriate probe for imaging and AFM scan type will then be selected and the desired sites scanned, recorded, and analyzed for relevant metrics.

Figure 3:
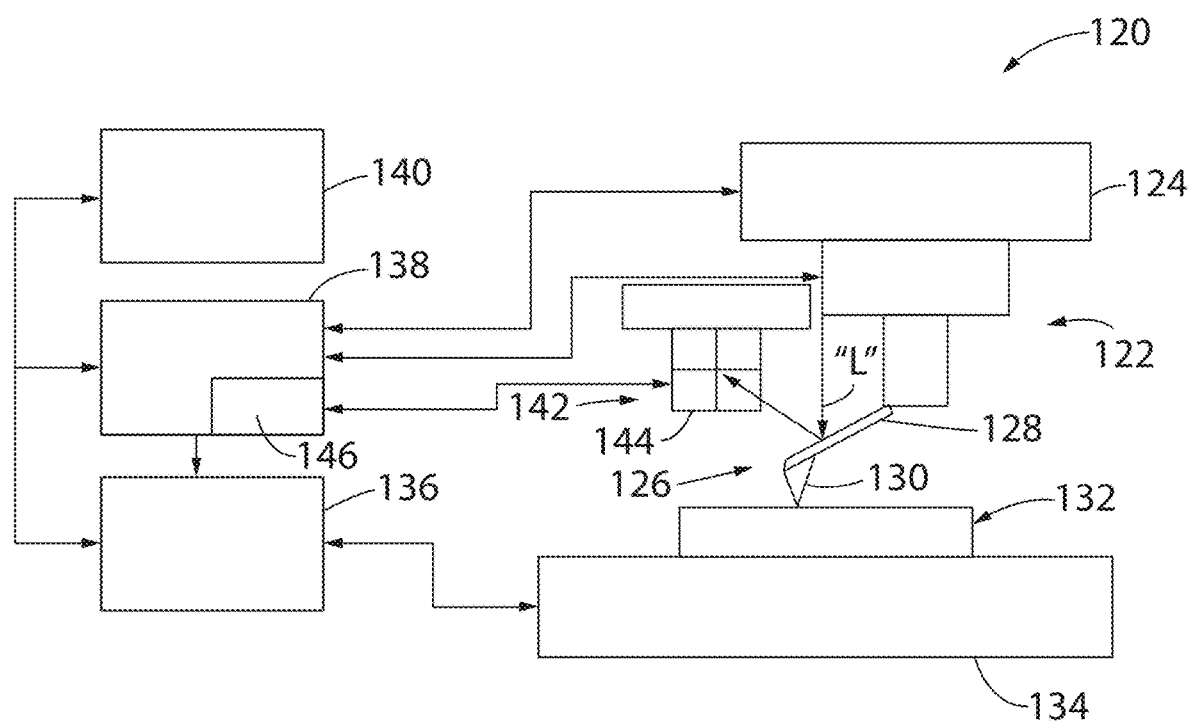
FIG. 3 is a schematic illustration of an AFM configured to implement the method shown in FIG. 2.

An AFP instrument 120 (e.g., AFM) according to a preferred embodiment is shown in FIG. 3. An XYZ scanner 122 (e.g., a piezoelectric tube scanner) is coupled to a mechanical Z-stage 124 and supports a probe assembly including a cantilever 128 having a tip 130 at its distal end. Tip 130 is scanned across a sample 132 that is mounted on an XY stage 134.

An XY stage controller 136 controls stage 134 to locate a region of interest on the sample as well as provide scanning motion (e.g., raster) between tip 130 and sample 132 at a selected scan speed. Controller 136 is responsive to AFM controller 138. A computer 140 implements controllers 136 and 138.

In operation, after tip 130 is engaged with sample 132, a high speed scan of the sample is initiated with XYZ scanner 122, as discussed previously. As tip 130 interacts with sample 132 in, e.g., contact mode AFM, the probe deflects and this deflection is measured by an optical beam-bounce deflection detection apparatus 142. Apparatus 142 includes a laser (not shown) that bounces a beam "L" off the backside of cantilever 128 and toward a photodetector 144 which transmits the deflection signal to, for example, a DSP 146 of AFM controller 138 for high speed processing of the deflection signal.

AFM controller 138 continuously determines a feed forward control signal, as described previously, and transmits that signal to stage 134 to maintain the Z position of the tip relative to the sample with the max Z-range of the probe.

Moreover, controller 138 determines and provides the AFM feedback to maintain deflection of the probe at the setpoint, controlling XYZ scanner 122. This control is further illustrated in FIG. 4.

Figure 4:
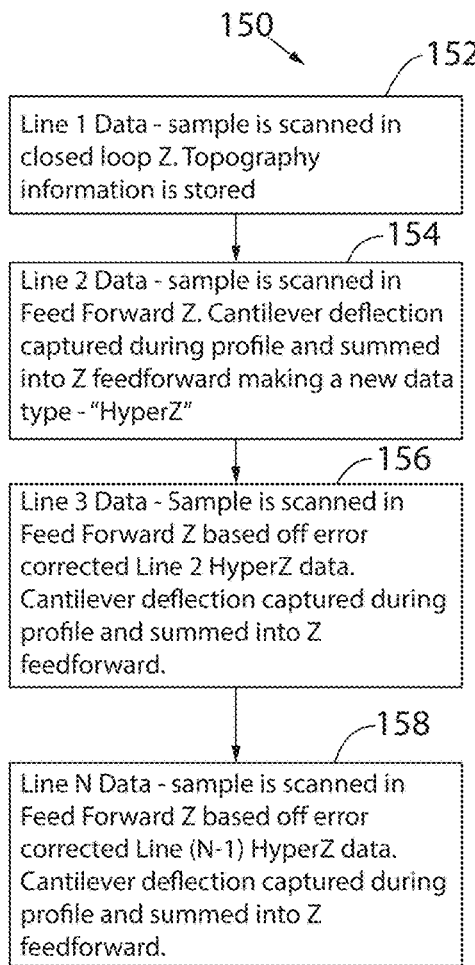
FIG. 4 is an illustration of the AFP data obtained using the method shown in FIG. 2.
Figure 5:
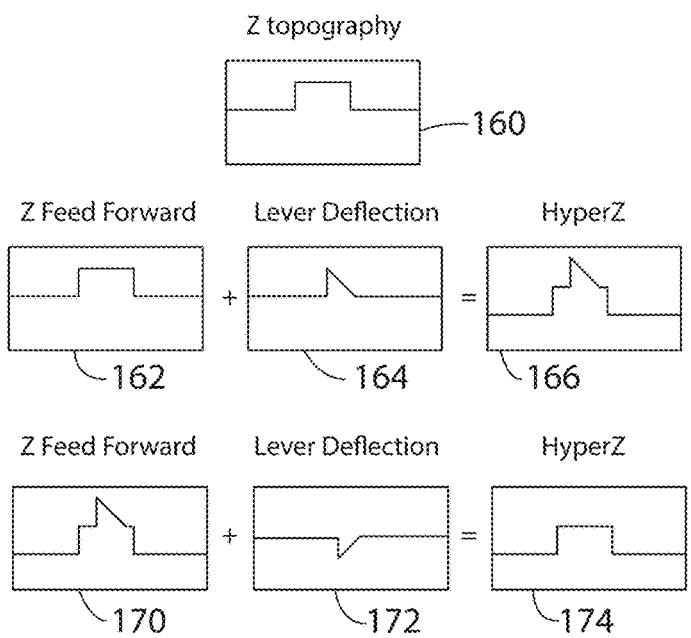
FIG. 5 is a series of schematic images illustrating the data obtained as shown in FIG. 4.
Figure 6:
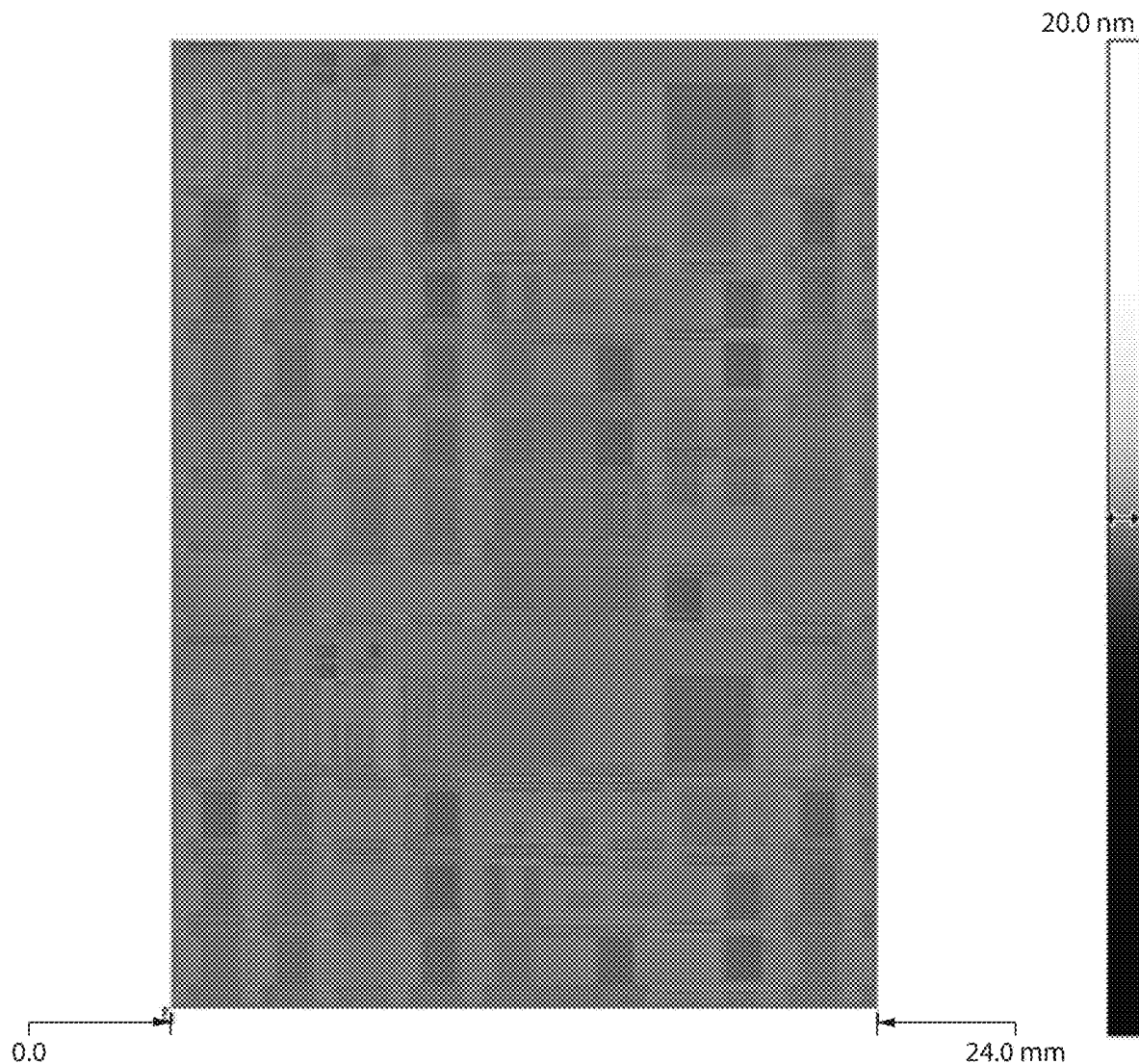
FIG. 6 is a die map image of a semiconductor sample captured using the methods shown and described herein.

Turning to FIGS. 4 and 5, an illustration of the AFP control (FIG. 4) of the preferred embodiments including the data gathered at each step (FIG. 5) is provided. Control scheme 150 first operates to capture a first line of data in Block 152. The corresponding topography information 160 is stored (but typically not displayed because this is not the data that will ultimately be used to, for example, identify post-CMP hot spots). Thereafter, in Block 154, the AFM operates to obtain a second line of data. In this case, the feed forward Z signal (Block 162) generated by Block 152 is used to essentially provide a starting point for the subsequent (e.g., line two) scan. The measured cantilever deflection captured during profiling (Block 164) is summed into the Z feedforward signal (Block 162) to provide a new data type, called HyperZ data (Block 166).

In the next scan line, line 3 in this example, the feed forward Z signal in Block 170 is based off the error-corrected line two HyperZ data (Block 168). In this step of the method, Block 156, the sample is scanned and the cantilever deflection (Block 172) is captured during profiling. A new HyperZ data set is generated (Block 174). These steps are repeated in Block 158 in which the feed forward Z signal based on the error corrected line (N−1) is used to generate new HyperZ data. In each case, the cantilever deflection captured during profiling is summed in to Z feedforward to provide the high speed data. This implementation has been shown to achieve HyperZ data capture at a scan speed of about 30 mm/s.

This new approach is capable of imaging an area of at least, but not limited to, a die area of 33 mm×26 mm. An image of such a sample is shown in FIG. 5. It is worth noting again that data collected in the first profile line is not stored in the image. The image data collection starts from line 2. The line 2 stage motion is the reverse of line 1 stage motion. After line 2, there is an additional orthogonal stage offset to get to the next line.

The method and apparatus provides high resolution detection of surface features with Z heights of >2 nm at XY pixel sizes of <1 um, with lateral scanning speeds of at least ~30 mm/s. As a result of the lateral scanning speed, the new method allows the 33 mm×26 mm die area to be imaged in approximately 12% of the time of current methods—17 hours vs 142 hours—providing a significant increase in productivity (throughput) and usefulness.

This improvement also defines a new approach and application for Atomic Force Profilometry (AFP) which allows for full lithography scan fields to be measured, enabling post-CMP hotspot detection and subsequent automatic high resolution Atomic Force Microscopy (AFM) imaging for hot spot metrology.

Although the best mode contemplated by the inventors of carrying out the present invention is disclosed above, practice of the above invention is not limited thereto. It will be manifest that various additions, modifications and rearrangements of the features of the present invention may be made without deviating from the spirit and the scope of the underlying inventive concept.

We claim:

1. A method of atomic force profilometry (AFP), the method comprising:
    providing relative scanning motion between a probe of the AFM and a sample at a first line of the sample;
    measuring the deflection of the probe in response to the providing step and controlling the probe-sample separation according to a mode of AFM operation;
    generating a feed forward Z signal based on the measuring step;
    providing relative scanning motion between the probe and the sample at a second line of the sample;
    measuring the deflection of the probe in the second line and controlling the probe-sample separation according to a mode of AFM operation with a control signal;
    combining the feedforward Z signal with the measured deflection corresponding to the second line to generate a HyperZ signal;
    using the HyperZ signal in a next line of the scan as the feed forward Z signal; and
    generating an image of the sample using the control signal.

2. The method of claim 1, repeating all steps until a region of interest of the sample is imaged.

3. The method of claim 2, further comprising identifying a feature of interest based on an output of the repeating step.

4. The method of claim 3, further comprising performing high resolution AFM imaging of the feature of interest.

5. The method of claim 1, wherein the providing step is performed at a speed greater than 2 mm/s.

6. The method of claim 1, wherein the providing step is performed at a speed greater than 25 mm/s.

7. The method of claim 1, wherein surface features of the sample are >2 nm at XY pixel sizes of <1 um, and wherein a lateral scanning speed is at least about 30 mm/s.

8. The method of claim 1, wherein the mode is one of an instantaneous force detecting mode and tapping mode.

9. The method of claim 1, further comprising calibrating the deflection sensitivity of a cantilever of the probe.

10. The method of claim 9, wherein the deflection sensitivity of the cantilever of the probe is calibrated using an independent reference sample.

11. An atomic force microscope (AFM) comprising:
    a scanner that provides relative scanning motion between a probe of the AFM and a sample;
    a detector that measures the deflection of the probe in response to probe-sample interaction during AFM operation;
    a controller that generates a feed forward Z signal based on the measured deflection corresponding to a first line of the scanning motion, and combines the feedforward Z signal with the measured deflection corresponding to a second line of the scanning motion to generate a HyperZ signal; and
    wherein the HyperZ signal is used in a next line of the scanning motion as the feed forward Z signal.

12. The AFM of claim 11, wherein surface features of the sample are >2 nm at XY pixel sizes of <1 um, and wherein a lateral scanning speed of the scanner is at least about 30 mm/s.

13. The AFM of claim 11, wherein the AFM is operated in one of an instantaneous force detecting mode, contact mode and tapping mode.

14. The AFM of claim 11, wherein the scanner operates at a speed greater than 2 mm/s.

15. A method of operating an atomic force profiling (AFP) instrument for post-CMP hotspot detection on a semiconductor sample, the method comprising:
    providing relative scanning motion between a probe of the AFP and a sample at a first line of the sample;

measuring the deflection of the probe in response to the providing step and controlling the probe-sample separation according to a mode of AFM operation;

generating a feed forward Z signal based on the measuring step;

providing relative scanning motion between the probe and the sample at a second line of the sample using the feed forward Z signal;

measuring the deflection of the probe in the second line and controlling the probe-sample separation according to a mode of AFM operation;

combining the feedforward Z signal with the measured deflection corresponding to the second line to generate a HyperZ signal;

using the HyperZ signal in a next line of the scan as the feed forward Z signal;

repeating the above steps for a region of interest to generate HyperZ data based on the HyperZ signals; and identifying a post-CMP hotspot of the sample based on the HyperZ data.

16. The method of claim 15, wherein the mode is an instantaneous force detecting mode.

17. The method of claim 15, wherein the providing step is performed at a speed greater than 33 mm/s.

18. The method of claim 15, wherein surface features of the sample are >2 nm at XY pixel sizes of <1 um, and wherein a lateral scanning speed is at least about 30 mm/s.

19. The method of claim 15, wherein the providing step is performed for high resolution AFM scanning.

* * * * *